United States Patent [19]
Chenoweth

[11] Patent Number: 5,152,393
[45] Date of Patent: Oct. 6, 1992

[54] MICROCHIP STORAGE TAPE

[75] Inventor: Dean B. Chenoweth, Eden Prairie, Minn.

[73] Assignee: Advantek, Inc., Eden Prairie, Minn.

[21] Appl. No.: 726,748

[22] Filed: Jul. 8, 1991

[51] Int. Cl.$^5$ .................................. B65D 73/02
[52] U.S. Cl. ........................ 206/330; 206/331
[58] Field of Search ........................ 206/330, 331

[56] References Cited

U.S. PATENT DOCUMENTS

| | | | |
|---|---|---|---|
| 4,564,880 | 1/1986 | Christ et al. | 206/334 X |
| 4,702,370 | 10/1987 | Honda | 206/331 |
| 4,726,534 | 2/1988 | Chenoweth | 242/71.9 |
| 4,898,275 | 2/1990 | Skrtic et al. | 206/330 |
| 4,966,281 | 10/1990 | Kawanishi et al. | 206/330 |
| 5,026,303 | 6/1991 | Matsuoka et al. | 206/331 X |
| 5,066,245 | 11/1991 | Walker | 206/331 |
| 5,076,427 | 12/1991 | Thomson et al. | 206/330 |

FOREIGN PATENT DOCUMENTS 127256 5/1990 Japan .................... 206/330
PCT/GB89/-
01283 10/1989 PCT Int'l Appl.

Primary Examiner—William I. Price
Attorney, Agent, or Firm—Burd, Bartz & Gutenkauf

[57] ABSTRACT

A tape has a plurality of recesses for carrying electronic microchips. Each recess has a bottom wall having ridges surrounding the center of the recess. The ridges engage the microchip to center the microchip within the recess and space leads connected to the microchip from the side walls and end walls of the recess. Support members extending angularly between the ridge ends are adapted to elevate the microchip above the bottom wall of the recess and space the leads from the bottom wall. A cover is releasably attached to the tape to close the top of the recess. A hole in the bottom wall of the recess allows optical readings to verify the position of the microchip. A modification of the tape has a plurality of recesses for carrying electronic microchips having corner ears. Each recess has corner supports for supporting the corner ears of the microchip. The corner supports elevate the microchip and space leads connected to the microchip from the recess walls. The microchip ears engage side walls and end walls of the recess to locate the microchip in a centered position within the recess.

34 Claims, 4 Drawing Sheets

MICROCHIP STORAGE TAPE

FIELD OF THE INVENTION

The invention relates to tapes having pockets for storage of electronic components, such as microchips.

BACKGROUND OF THE INVENTION

Commonly, microchips having a general rectangular shape are stored in trays. The trays have adjacent recesses to accommodate the microchips. These trays can be stacked on top of each other. This provides nominal protection to the delicate wire leads projecting from the sides of the microchip. Microchip movement within the trays is relatively unrestricted. This may cause inadvertent damage to the leads. Further, detection of placement and location of the microchips within the tray is not possible.

SUMMARY OF THE INVENTION

The invention is directed to a tape adapted to carry one or more electronic microchips while preventing damage to the leads connected to the microchips. The tape can be wound on a reel wheel for storage.

The tape is an elongated strip member having a plurality of generally rectangular laterally spaced recesses therein for accommodating microchips having projecting leads. Each recess has an open top, side walls and end walls joined to a bottom wall. The bottom wall has a pair of upwardly directed inverted V-shaped first ridges that extend parallel to the side walls of the recess. A pair of upwardly directed inverted V-shaped second ridges are located outwardly from and are centered between the first ridges. The second ridges extend parallel to the end walls of the recess. The first and second ridges are engageable with the microchip to retain the microchip within the center portion of the recess. This spaces the leads of the microchip inwardly from the side walls and end walls of the recess. The ridges have inner inclined surfaces that are complimentary to the outer surfaces of the microchip to facilitate positioning of and to hold the microchip within the center portion of the recess. Each ridge has upwardly and inwardly inclined ends that are angularly disposed relative to the longitudinal axis of the ridge. The inclined ends of the ridges also facilitate placement of the microchip in the storage position within the recess.

The tape has a plurality of rectangular shaped support members for supporting the microchip in an elevated position above the bottom wall. This spaces the leads of the microchip upwardly from the bottom wall of the recess and the first and second ridges. The support members extend angularly between adjacent ends of the first and second ridges. Each support member has a top wall located above the bottom wall of the recess. The ridges have top edges that are located above the top walls of the support members. When the microchip is located in the storage position, the microchip is supported on the support members to elevate the microchip above the bottom wall. The top portions of the ridges that extend above the support members engage the outer surfaces of the microchip to retain the microchip within the center portion of the recess. The leads of the microchip do not engage any structure of the tape thereby protecting the leads from damage. A cover closes the top of the recess to hold the microchip within the recess during winding and unwinding of the tape on and off a reel. An example of a tape reel is disclosed by D. B. Chenoweth in U.S. Pat. No. 4,726,534. The bottom wall of the recess has a hole for detecting the presence of the microchip within the recess. A light beam can be used to detect whether the recess contains a microchip before the cover is applied to the tape.

A modification of the tape is used to accommodate microchips having projecting leads and ears. The tape is an elongated strip member having at least one recess for storing the microchip. The recess has an open top, sidewalls and end walls joined to a bottom wall. The side walls and end walls are engageable with the ears of the microchip to retain the microchip within the recess. A plurality of support members are located in the corners of the recess. The support members extend inwardly from the side walls and end walls to the bottom wall of the recess. Each support member has a top wall that is located above the bottom wall of the recess. The support members are generally triangular shaped members having a convex shaped outer edge. The support members support the ears of the microchip whereby the microchip is located in an elevated position above the bottom wall of the recess. This spaces the leads of the microchip inwardly from the side walls and end walls of the recess and the support members and upwardly from the bottom wall. The leads do not engage any portion of the tape, thereby preventing damage to the leads. The side walls and end walls have inner inclined surfaces that are complimentary to the outer surfaces of the ears of the microchip to facilitate positioning of and to hold the microchip within the recess. A cover closes the top of the recess. The bottom wall has a hole to allow optical readings through the bottom wall to determine the presence of a microchip.

DESCRIPTION OF PREFERRED EMBODIMENTS

Figure 1:
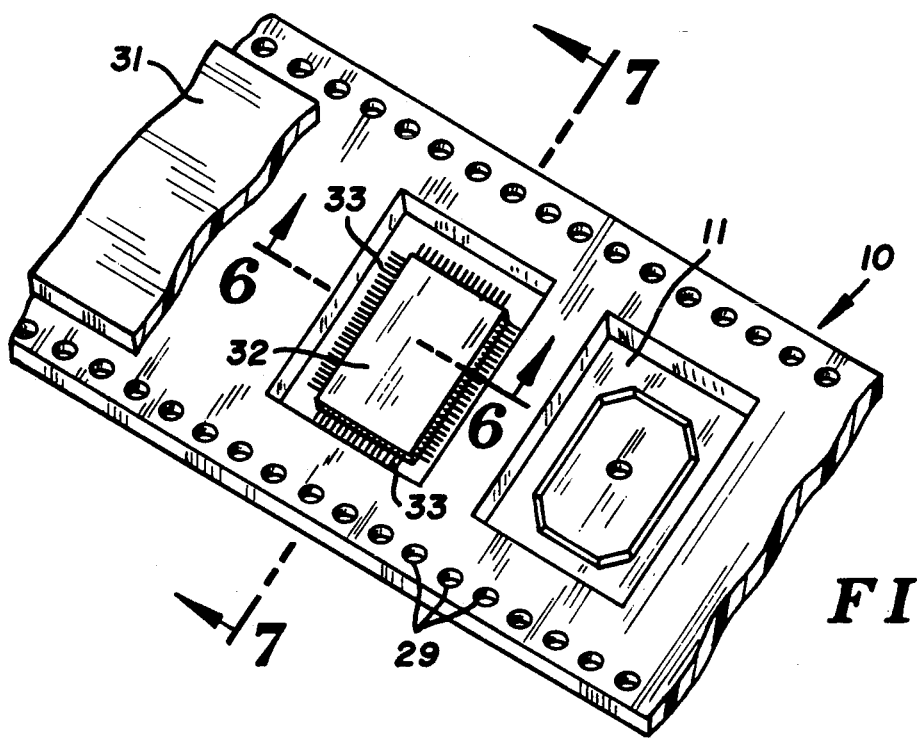
FIG. 1 is a perspective view of part of a tape carrying a microchip.

Referring to FIG. 1, there is shown a tape of the invention, indicated generally at 10, for accommodating electronic parts, such as microchips. Tape 10 stores the microchips while preventing damage to the leads connected to the microchips. Optical readings can be made through tape 10 to determine whether the microchips is in the pocket or recess in the tape.

Tape 10 is an elongated strip made of semi-flexible material, such as plastic and the like. A plurality of laterally spaced holes 29 extend through tape 10 adjacent the edges of the tape. Holes 29 can accommodate sprockets of a wheel (not shown) to allow tape 10 to be wound on and unwound from the wheel. Tape 10 has a plurality of laterally spaced rectangular pockets or recesses 11 that are centered between holes 29. Each recess 11 is adapted to accommodate a generally rectangular electronic part, such as a microchip 32 without damaging leads 33 connected to the microchip. A generally flat cover strip 31 releasably attached to the top surface of tape 10 closes recesses 11. Cover 31 holds microchips 32 within recesses 11 when tape 10 is wound on and unwound from a reel (not shown). An example of a tape reel is disclosed by D. B. Chenoweth in U.S. Pat. No. 4,726,534. Recesses 11 can have other shapes to accommodate microchips of various sizes and shapes.

Figure 2:
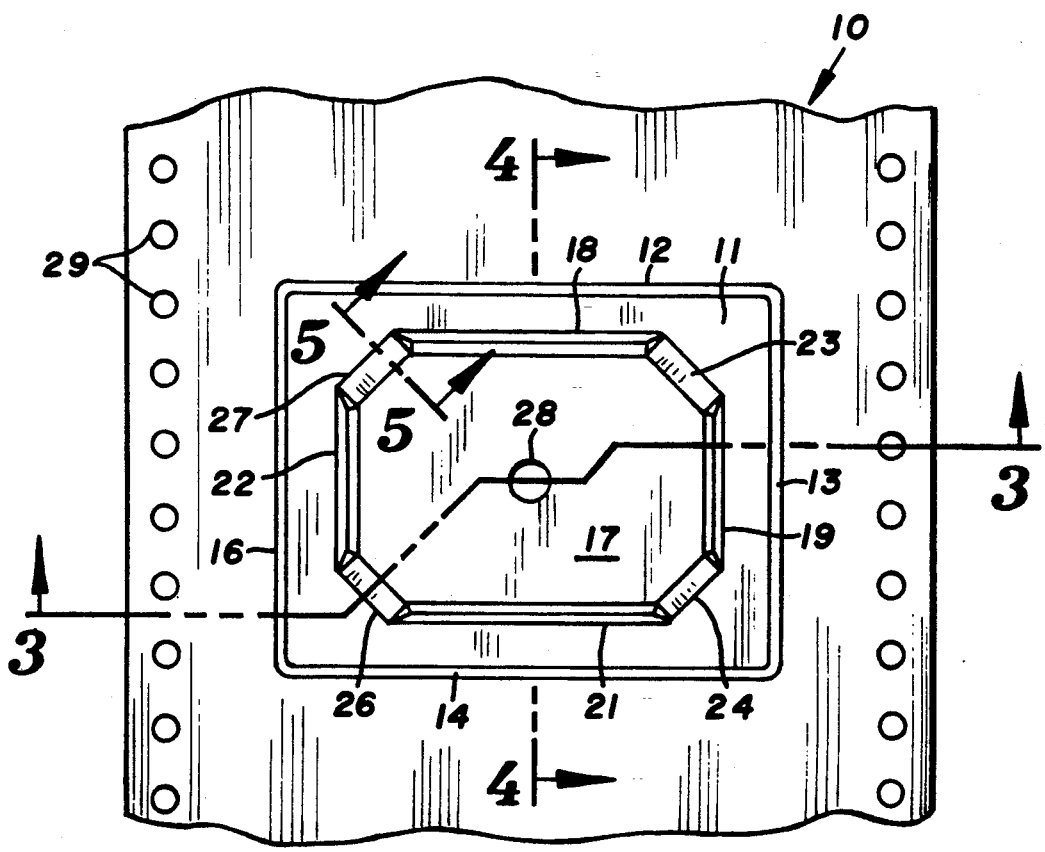
FIG. 2 is a top plan view of part of the tape of FIG. 1.
Figure 3:
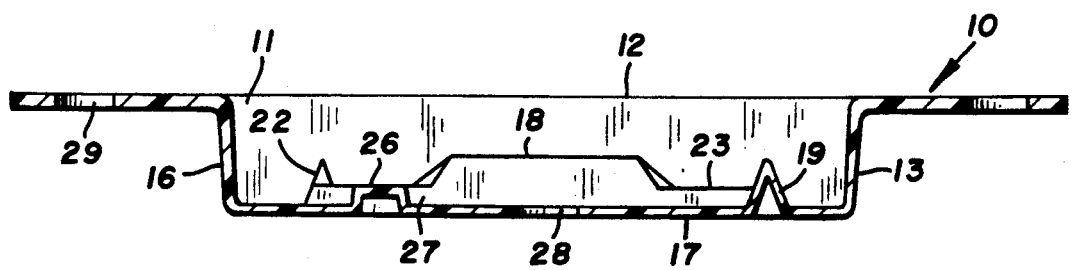
FIG. 3 is a sectional view taken along the line 3—3 of FIG. 2.
Figure 4:
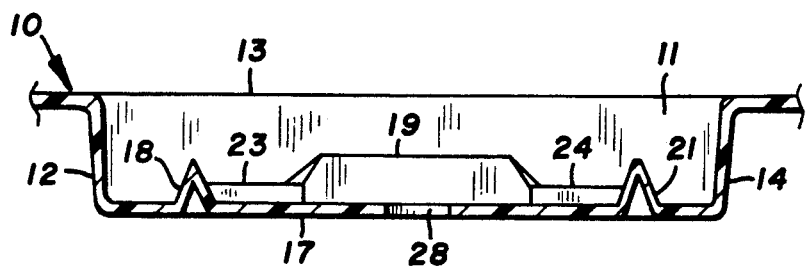
FIG. 4 is a sectional view taken along the line 4—4 of FIG. 2.

Referring to FIGS. 2 to 4, each recess 11 has a pair of downwardly directed side walls 12 and 14 that extend between downwardly directed end walls 13 and 16. The lower ends of walls 12, 13, 14 and 16 are joined to the outer peripheral edges of a generally rectangular bottom wall 17 to form recess 11. Bottom wall 17 has a plurality of upwardly projected ridges 18, 19, 21 and 22 for positioning microchip 32 within the center portion of recess 11 whereby leads 33 do not engage walls 12–14 and 16. Upwardly projected support shoulders 23, 24, 26 and 27 extend between adjacent ends 30 of ridges 18, 19, 21 and 22. The shoulders support microchip 32 in an elevated position above bottom wall 17 whereby leads 33 do not engage bottom wall 17 nor ridges 18, 19, 21 and 22. A centrally located hole 28 in bottom wall 17 is used to allow optical reading with a light beam to determine presence of microchip 32 in recess 11.

Ridges 18, 19, 21 and 22 are elongated linear members having an inverted V-shape. The length of ridge 18 is substantially the same as the length of ridge 21. The lengths of ridges 19 and 22 are substantially the same and are shorter than the lengths of ridges 18 and 21. Ridges 18, 19, 21 and 22 can have the same lengths. Ridges 18 and 21 extend parallel to and are inwardly spaced from side walls 12 and 14, respectively. Ridges 19 and 22 are inwardly spaced from and extend parallel to end walls 13 and 16, respectively. Ridge 18 is located outwardly from and centered between first ends of ridges 19 and 22. Similarly, ridge 21 is centered between and located outwardly from the opposite ends of ridges 19 and 22. Ridges 18 and 21 are laterally spaced apart at a distance approximately equal to the width of microchip 32. Ridges 19 and 22 are longitudinally spaced apart at a distance approximately equal to the length of microchip 32. Ridges 18, 19, 21 and 22 are engageable with the side walls 34 and 36 and end walls 37 and 38 of microchip 32 to retain the microchip within the central area of recess 11 surrounded by the ridges. This spaces leads 33 from walls 12–14 and 16 of recess 11 thereby preventing damage to the leads.

Figure 5:
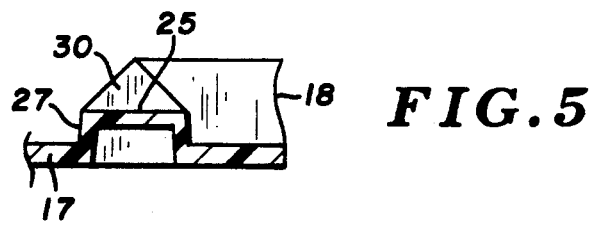
FIG. 5 is a sectional view taken along line 5—5 of FIG. 2.

Each ridge 18, 19, 21, 22 has upwardly and inwardly inclined ends 30, as shown in FIG. 5. Ends 30 are angularly disposed relative to the longitudinal axis of the ridge whereby the ends of the adjacent ridges face each other. Inclined ends 30 facilitate placement of microchip 32 on shoulder supports 23, 24, 26 and 27.

Shoulders 23, 24, 26 and 27 are generally rectangular members that project upwardly from bottom wall 17. Each shoulder extends diagonally between adjacent ends of ridges 18, 19, 21 and 22. As shown in FIG. 5, each shoulder has a generally flat top wall 25 for supporting a corner 39, 41, 42 of microchip 32. Top wall 25 is located above bottom wall 17 of recess 11 whereby microchip 32 is elevated above bottom wall 17. The top edges of ridges 18, 19, 21 and 22 are located above top walls 25 of shoulders 23, 24, 26 and 27. The top portions of the ridges that extend above the shoulders engage microchip walls 34, 36, 37 and 38 to hold the microchip within the central area of recess 11. The corners of microchip 32 are spaced from ends 30 of the ridges.

Figure 6:
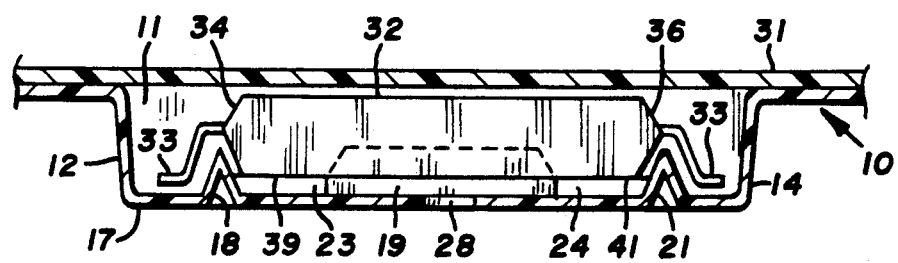
FIG. 6 is an enlarged sectional view taken along the line 6—6 of FIG. 1.
Figure 7:
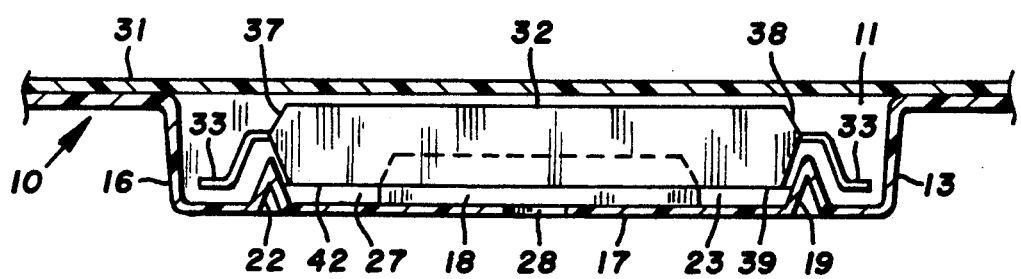
FIG. 7 is an enlarged sectional view taken along line 7—7 of FIG. 1.
Figure 8:
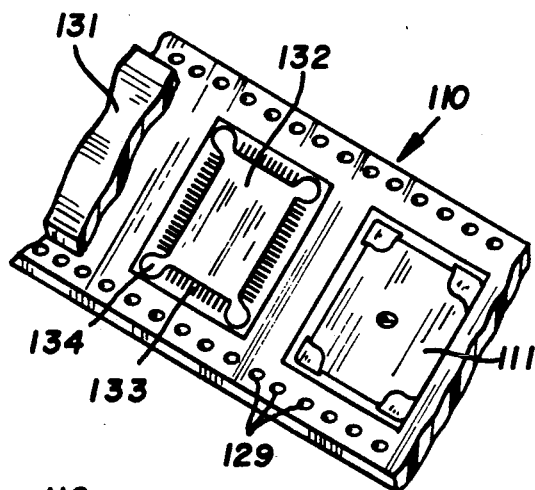
FIG. 8 is a perspective view of a modification of part of a tape carrying a microchip having corner ears.

Referring to FIGS. 6 and 7, side walls 34 and 36 and end walls 37 and 38 of microchip 32 have convex shaped outer surfaces. Microchip 32 has generally flat top and bottom surfaces. The inner inclined surfaces of ridges 18, 19, 21 and 22 are complimentary to the lower inclined surfaces of microchip walls 34, 36 to 38. This facilitates positioning of microchip 32 within the area surrounded by ridges 18, 19, 21 and 22 in recess 11. The inner inclined surfaces of the ridges cooperate with the lower inclined surfaces of microchip walls 34, 36 to 38 to adjust microchip 32 into the proper storage position within recess 11. For example, when microchip 32 is moved into recess 11 slightly off center toward end wall 19, end wall 38 of the microchip engages the inner surface of wall 19 whereby microchip 32 slides down into a centered position within the recess. The complimentary surfaces of ridges 18, 19, 21 and 22 and microchip walls 34, 36 to 38 also function to retain microchip 32 in the centered position within recess 11.

When microchip 32 is in the storage position within recess 11, corners 39, 41 and 42 of microchip 32 are supported on shoulders 23, 24 and 27, respectively, to elevate the microchip above bottom wall 17. Microchip 32 has a fourth corner supported on shoulder 26 in a similar manner. The top portions of ridges 18, 19, 21 and 22 engage microchip walls 34, 36 to 38 to retain the microchip within the central area of recess 11. As shown in FIGS. 6 and 7, leads 33 connected to microchip walls 34, 36 to 38 extend above the ridges and incline downwardly toward bottom wall 17. The ends of leads 33 are located in a position above bottom wall 17 and are inwardly spaced from walls 12 to 14 and 16 of recess 11. Leads 33 do not engage any structure of tape 10 when microchip 32 is located in the storage position within recess 11 whereby leads 33 are protected from damage. Cover 31 closes the top of recess 11 to hold microchip 32 within the recess when tape 10 is wound on and unwound from a reel. Hole 28 in bottom wall 17 allows the use of a light beam to detect whether recess 11 contains microchip 32.

Referring to FIGS. 8 to 13, there is shown a modification of the tape of the invention, indicated generally at 110, for carrying microchips 132 having corner ears 134. Tape 110 stores microchip 132 while preventing damage to leads 133 connected to the microchip. Optical readings can be made through tape 110 to determine whether microchip 132 is in position on the tape.

Tape 110 is an elongated strip of semi-flexible plastic material. A plurality of laterally spaced holes 129 extend through tape 110 adjacent the edges of the tape. Holes 129 can accommodate sprockets of a wheel (not shown) to allow tape 110 to be wound on and unwound from the wheel. Tape 110 has a plurality of laterally spaced rectangular pockets or recesses 111 that are centered between holes 129. Each recess 111 is adapted to accommodate a microchip 132 having corner ears 134. Leads 133 of the microchip ar not damaged when microchip 132 is located in recess 111. A generally flat cover strip 131 releasably attached to the top of tape 110 closes recess 111. Cover 131 holds microchip 132 within recess 111 during winding and unwinding of tape 110.

Figure 9:
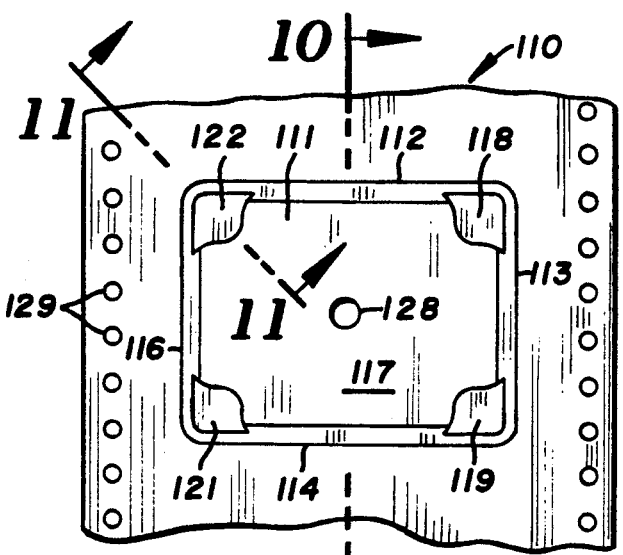
FIG. 9 is a top view of part of the tape of FIG. 8.
Figure 10:
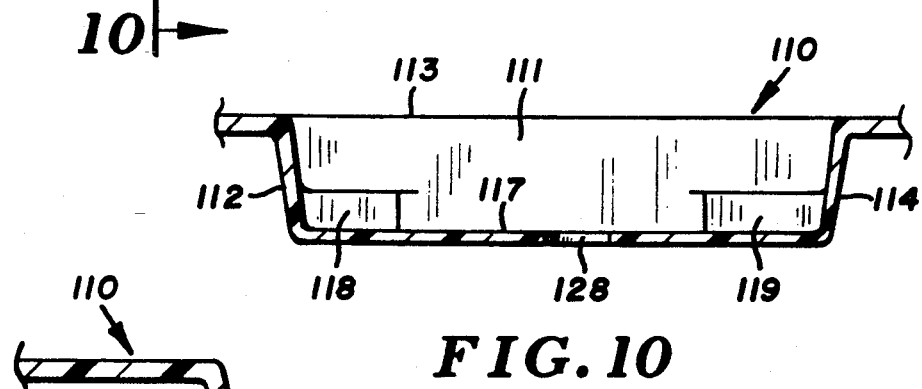
FIG. 10 is a sectional view taken along line 10—10 of FIG. 9.
Figure 11:
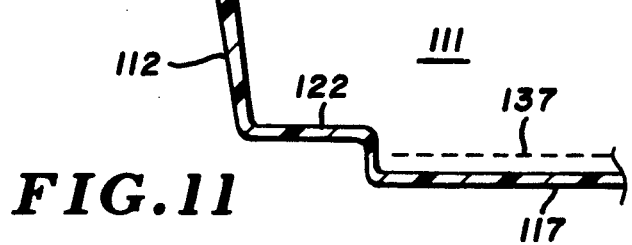
FIG. 11 is a sectional view taken along line 11—11 of FIG. 9.

Referring to FIGS. 9 to 11, each recess 111 has a pair of downwardly and inwardly inclined side walls 112 and 114 that extend between downwardly and inwardly inclined end walls 113 and 116. The lower ends of walls 112 to 114 and 116 are joined to the outer peripheral edges of a generally rectangular bottom wall 117 to form recess 111. Side walls 112 and 114 and end walls 113 and 116 are engageable with ears 134 to retain microchip 132 within the central area of recess 111. Bottom wall 117 has a centrally located hole 128 that is used to allow optical reading with a light beam to determine whether recess 11 contains microchip 132.

Each corner of recess 111 has an inwardly directed corner support 118, 119, 121, 122 for supporting a corner ear 134 of microchip 132. Corner supports 118, 119, 121 and 122 allow microchip 132 to be located in an elevated position above bottom wall 117 whereby the ends of leads 133, indicated by broken line 137 in FIG. 11, are spaced from and do not engage the bottom wall.

Figure 12:
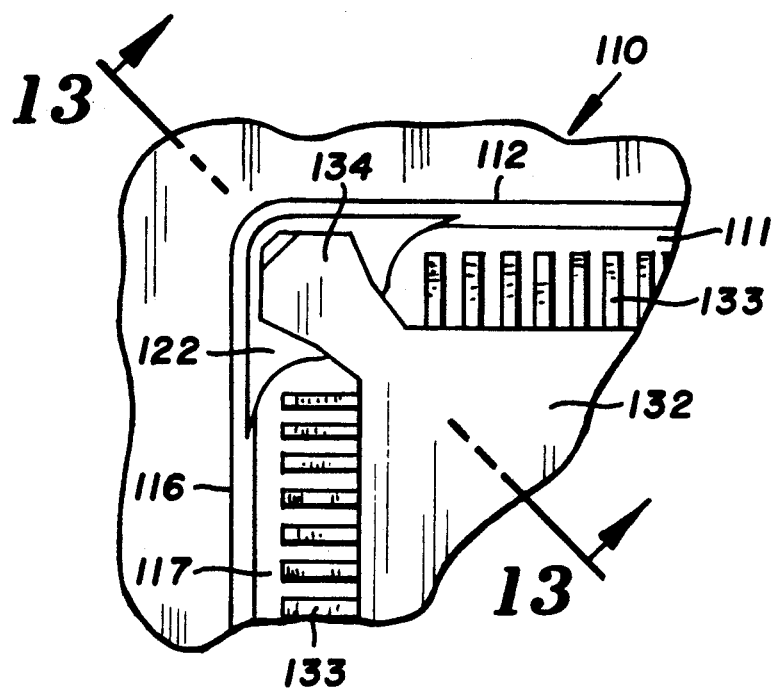
FIG. 12 is an enlarged top view of the tape of FIG. 8 showing a corner ear of the microchip located on a support shoulder.
Figure 13:
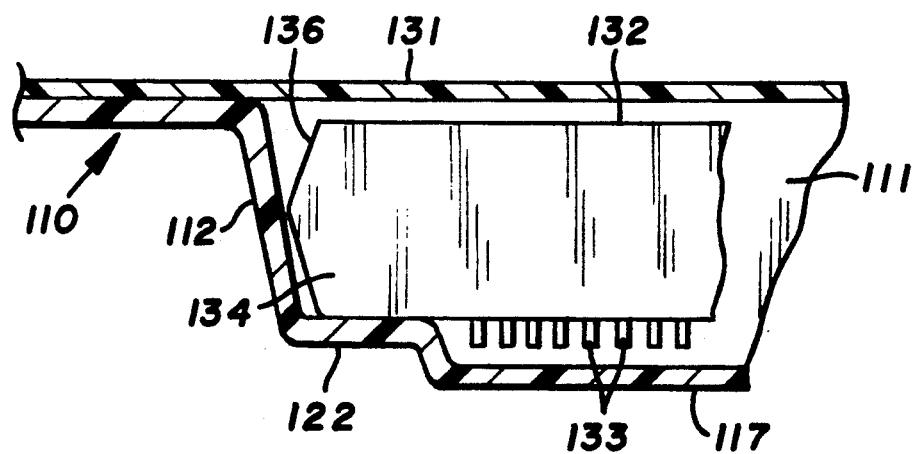
FIG. 13 is a sectional view taken along line 13—13 of FIG. 12.

Corner supports 118, 119, 121 and 122 are generally triangular shaped members having a flat top surface located above bottom wall 117 and below the top of recess 111. As shown in FIGS. 11 and 13, corner support 122 extends inwardly from recess wall 112 parallel to bottom wall 117 and downwardly to the bottom wall. Corner supports 118, 119 and 121 extend in a similar manner relative to the corresponding walls of recess 111. Each corner support has a convex shaped outer edge. The length of corner supports 118, 119, 121 and 122 is approximately equal to the length of ears 134 of microchip 132. When ears 134 are supported on the corner supports, as shown in FIGS. 12 and 13, leads 133 are spaced from and do not engage the outer edges of corner supports 118, 119, 121 and 122 nor recess walls 112, 113, 114 and 116. Walls 112 to 114 and 116 engage ears 134 to hold microchip 132 in a centered position within recess 111 thereby preventing lead contact with the sides walls and end walls of the recess. This preserves the shape and extension of the delicate leads 133 of microchip 132 when the microchip is located in the storage position within recess 111.

Referring to FIGS. 12 and 13, Corner ears 134 Of microchip 132 have convex shaped end surfaces 136 joined to inwardly directed side surfaces. Microchip 132 has generally flat top and bottom surfaces. The inner inclined surfaces of recess walls 112, 113, 114 and 116 are complimentary to the lower inclined surfaces of corner ear ends 136. The side surfaces of corner ears 134 extend generally parallel to the respective recess walls 112 to 114 and 116. The inner inclined surfaces of walls 112 to 114 and 116 cooperate with the lower inclined surfaces of corner ear ends 136 to adjust microchip 132 into the proper storage position within recess 111. This facilitates positioning of microchip 132 within recess 111. For example, when microchip 132 is placed into recess 111 slightly off center toward the junction of recess walls 112 and 116, end 136 and the side surfaces of corner ear 134 engage the inner inclined surfaces of walls 112 and 116 whereby microchip 132 slides down into a centered position within the recess. The complimentary surfaces of walls 112 to 114 and 116 and corner ears 134 also function to retain microchip 132 in the centered position within recess 111.

When microchip 132 is in the storage position within recess 111, corner ears 134 of the microchip are supported on corner supports 118, 119, 121 and 122 to elevate the microchip above bottom wall 117. Ears 134 engage recess walls 112 to 114 and 116 to retain microchip 132 in the centered position within the recess. As shown in FIGS. 12 and 13, leads 133 connected to microchip 132 extend outwardly and incline downwardly away from the microchip. Leads 133 are located in a position above bottom wall 117 and are inwardly spaced from walls 112 to 114 and 116 of recess 111. Leads 133 do not engage any structure of tape 110 when microchip 132 is located in the storage position within recess 111 whereby leads 133 are protected from damage. Cover 131 closes the top of recess 111 to hold microchip 132 within the recess when tape 110 is wound on and unwound from a storage reel. Hole 128 in bottom wall 117 allows the use of a light beam to detect whether recess 111 contains microchip 132.

While there have been shown and described preferred embodiments of the tape of the invention, it is understood that changes in structure, arrangement of structure, and materials may be made by those skilled in the art without departing from the invention. The invention is defined in the following claims.

I claim:

1. A tape for accommodating microchips having outwardly projecting leads comprising: an elongated strip means having at least one recess for storing the microchip, the recess having a bottom wall, an open top, side walls, and end walls, said side walls and end walls being joined to said bottom wall, the bottom wall having first means engageable with the microchip to retain the microchip within center portion of the recess thereby spacing the leads of the microchip inwardly from the side walls and end walls, said first means comprising a plurality of members projected upwardly from said bottom wall, each of said members having an opposite end, said opposite ends of adjacent members being spaced from each other, and second means connected to the first means for supporting the microchip in an elevated position above the bottom wall whereby the leads of the microchip are spaced above the bottom wall and extend outwardly of the first means, said second means comprising a plurality of supports for the microchip joined to adjacent opposite ends of said members, each support having a top wall located in a plane above the bottom wall, and said members having top edges located in a plane above said top wall thereby holding the microchip in an elevated position above the bottom wall with the leads of the microchip spaced inwardly from the side walls and end walls of the strip means.

2. The tape of claim 1 wherein: the members are elongated linear ridges, each of said ridges having an inverted generally V-shaped cross section with top edges located in a horizontal plane, said top wall of each support having a generally flat horizontal surface located in a horizontal plane below the horizontal plane of the top edges for accommodating a portion of said microchip.

3. The tape of claim 2 wherein: each ridge has an inner inclined surface complimentary to an outer surface of the microchip.

4. A tape for accommodating microchips having outwardly projecting leads comprising: an elongated strip member having at least one recess for storing a microchip, the recess having bottom walls, an open top, side walls and end walls, said side walls and end walls being joined to a bottom wall, the bottom wall having first means comprising a plurality of upwardly directed ridges surrounding the center portion of the recess engageable with the microchip to retain the microchip within a center portion of the recess, said ridges being laterally spaced from the side walls and end walls of the recess thereby spacing the leads of the microchip inwardly from the side walls and end walls, the ridges are inverted V-shaped members, each inverted V-shaped member having upwardly and inwardly inclined ends, and second means connected to the first means for supporting the microchip in an elevated position above the bottom wall whereby the leads of the microchip are spaced above the bottom wall and extend outwardly of the first means thereby holding the microchip in an elevated position above the bottom wall with the leads of the microchip spaced inwardly from the side walls and end walls of the strip member.

5. The tape of claim 4 wherein: the ends are angularly disposed relative to a longitudinal axis of the inverted V-shaped member.

6. A tape of accommodating microchips having outwardly projecting leads comprising: an elongated strip member having at least one recess for storing a microchip, the recess having a bottom wall, an open top, side walls and end walls said side walls, and end walls being joined to said bottom wall, the bottom wall having first means engageable with the microchip to retain the microchip within a center portion of the recess thereby spacing the leads of the microchip inwardly from the side walls and end walls, said first means having ends, and second means connected to the first means and extended angularly between ends of the first means fur supporting the microchip in an elevated position above the bottom wall whereby the leads of the microchip are spaced above the bottom wall and extend outwardly of the first means thereby holding the microchip in an elevated position above the bottom wall with the leads of the microchip spaced inwardly from the side walls and end walls of the strip member.

7. The tape of claim 6 wherein: the second means comprises a plurality of rectangular shaped members.

8. A tape for accommodating microchips having outwardly projecting leads comprising: an elongated strip member having at least one recess for storing the microchip, the recess having a bottom wall, an open top, side walls and end walls, said side walls and end walls being joined to said bottom wall, the bottom wall having first means engageable with the microchip to retain the microchip within a center portion of the recess thereby spacing the leads of the microchip inwardly from the side walls and end walls, said first means having ends, and second means connected to the first means for supporting the microchip in an elevated position above the bottom wall, said second means comprising: a plurality of support members extending angularly between the ends of the first means, each support member having a top wall located above the bottom wall whereby the leads of the microchip are spaced above the bottom wall and extend outwardly of the first means thereby holding the microchip in an elevated position above the bottom wall with the leads of the microchip spaced inwardly from the side walls and end walls of the strip member.

9. The tape of claim 8 wherein: the first means comprises a plurality of upwardly directed ridges surrounding the center portion of the recess, each ridge having a top edge located above the top wall.

10. The tape of claim 9 wherein: each ridge has an inner inclined surface complimentary to an outer surface of the microchip.

11. The tape of claim 8 wherein: the bottom wall has a hole for detecting the presence of the microchip within the recess.

12. The tape of claim 8 including: cover means releasably attachable to the strip member for closing the top of the recess.

13. A tape for accommodating at least one microchip having projecting leads comprising: an elongated strip member having a plurality of generally rectangular laterally spaced recesses therein, each recess having an open top, side walls and end walls joined to a bottom wall, the bottom wall having first ridge means extending parallel to the side walls and second ridge means extending parallel to the end walls, the first ridge means located outwardly from the second ridge means, the first and second ridge means engageable with the microchip to retain the microchip within a center portion of the recess thereby spacing the leads of the microchip inwardly from the side walls and end walls, and support means extending between the first and second ridge means for supporting the microchip in an elevated position above the bottom wall whereby the leads of the microchip are spaced upwardly from the bottom wall and the first and second ridge means.

14. The tape of claim 13 wherein: the first ridge means comprises a pair of upwardly directed inverted V-shaped first ridges, the second ridge means comprising a pair of upwardly directed inverted V-shaped second ridges.

15. The tape of claim 14 wherein: the first ridges are centered between the second ridges.

16. The tape of claim 14 wherein: each first ridge and second ridge has an inner inclined surface complimentary to an outer surface of the microchip.

17. The tape of claim 13 wherein: the first and second ridge means are inverted V-shaped members, each inverted V-shaped member having upwardly and inwardly inclined ends.

18. The tape of claim 17 wherein: the ends are angularly disposed relative to a longitudinal axis of the inverted V-shaped member.

19. The tape of claim 13 wherein: the support means extend angularly between ends of the first ridge means and ends of the second ridge means.

20. The tape of claim 19 wherein: the support means comprises a plurality of rectangular shaped members.

21. The tape of claim 13 wherein: the support means comprises a plurality of support members extending angularly between ends of the first ridge means and ends of the second ridge means, each support member having a top wall located above the bottom wall.

22. The tape of claim 21 wherein: the first ridge means comprises a pair of upwardly directed first ridges, the second ridge means comprising a pair of upwardly directed second ridges, each first and second ridge having a top edge located above the top wall.

23. The tape of claim 22 wherein: each first and second ridge has an inner inclined surface complimentary to an outer surface of the microchip.

24. The tape of claim 13 wherein: the bottom wall has a hole for detecting the presence of the microchip within the recess.

25. The tape of claim 24 including: cover means releasably attachable to the strip member for closing the top of the recess.

26. A tape for accommodating at least one microchip having projecting leads and ears comprising: an elongated strip member having at least one recess for storing the microchip, the recess having an open top, side walls and end walls joined to a bottom wall, the side walls and end wall engageable with the ears of the microchip to retain the microchip within the recess, and support means for supporting the ears of the microchip whereby the microchip is located in an elevated position above the bottom wall and the leads of the microchip are spaced inwardly from the support means, side walls and end walls and upwardly from the bottom wall.

27. The tape of claim 26 wherein: the support means comprises a plurality of support members, each support member located in a corner of the recess.

28. The tape of claim 27 wherein: each support member has a top wall located above the bottom wall of the recess.

29. The tape of claim 28 wherein: each support member is a generally triangular shaped member having a convex shaped outer edge.

30. The tape of claim 26 wherein: each side wall and end wall has an inner inclined surface complimentary to an outer surface of one of the ears.

31. The tape of claim 30 wherein: the support means comprises a plurality of support members extending inwardly from the side walls and end walls to the bottom wall, each support member located in a corner of the recess.

32. The tape of claim 31 wherein: each support member has a top wall located above the bottom wall of the recess.

33. The tape of claim 26 wherein: the bottom wall has a hole for detecting the presence of the microchip within the recess.

34. The tape of claim 33 including: cover means releasably attachable to the strip member for closing the top of the recess.

* * * * *